(12) United States Patent
Alzheimer et al.

(10) Patent No.: US 7,847,626 B2
(45) Date of Patent: Dec. 7, 2010

(54) STRUCTURE AND METHOD FOR COUPLING SIGNALS TO AND/OR FROM STACKED SEMICONDUCTOR DIES

(75) Inventors: Joshua Alzheimer, Boise, ID (US); Beau Barry, Boise, ID (US)

(73) Assignee: Micron Technology, Inc., Boise, ID (US)

(*) Notice: Subject to any disclaimer, the term of this patent is extended or adjusted under 35 U.S.C. 154(b) by 38 days.

(21) Appl. No.: 12/074,562

(22) Filed: Mar. 4, 2008

(65) Prior Publication Data
US 2009/0224822 A1    Sep. 10, 2009

(51) Int. Cl.
*H01L 25/00* (2006.01)

(52) U.S. Cl. ........................ 327/566; 327/407

(58) Field of Classification Search ............ 327/99, 327/407–413, 564–566, 142, 143, 198, 217
See application file for complete search history.

(56) References Cited

U.S. PATENT DOCUMENTS

| | | | | |
|---|---|---|---|---|
| 5,008,548 A | * | 4/1991 | Gat | 250/372 |
| 5,928,378 A | * | 7/1999 | Choi | 714/795 |
| 6,070,263 A | * | 5/2000 | Tsui et al. | 714/795 |
| 6,137,311 A | * | 10/2000 | Hedberg | 326/68 |
| 6,169,417 B1 | * | 1/2001 | Pedersen | 326/40 |
| 6,624,506 B2 | | 9/2003 | Sasaki et al. | 257/686 |
| 6,845,490 B2 | * | 1/2005 | Natsume | 716/1 |
| 6,848,074 B2 | * | 1/2005 | Coombs | 714/795 |
| 7,137,059 B2 | * | 11/2006 | Cameron et al. | 714/794 |
| 7,532,058 B2 | * | 5/2009 | Chen et al. | 327/525 |
| 2003/0062612 A1 | | 4/2003 | Matsuo et al. | 257/686 |
| 2005/0181546 A1 | | 8/2005 | Madurawe | 438/132 |

FOREIGN PATENT DOCUMENTS

JP    2007-194444    8/2007

* cited by examiner

*Primary Examiner*—Long Nguyen
*Assistant Examiner*—Sibin Chen
(74) *Attorney, Agent, or Firm*—Dorsey & Whitney LLP

(57) ABSTRACT

Signals are coupled to and from stacked semiconductor dies through first and second sets of external terminals. The external terminals in the second set are connected to respective conductive paths extending through each of the dies. Signals are coupled to and from the first die through the first set of external terminals. Signals are also coupled to and from the second die through the conductive paths in the first die and the second set of external terminals. The external terminals in first and second sets of each of a plurality of pairs are connected to an electrical circuit through respective multiplexers. The multiplexers in each of the dies are controlled by respective control circuits that sense whether a die in the first set is active. The multiplexers connect the external terminals in either the first set or the second set depending on whether the bonding pad in the first set is active.

26 Claims, 3 Drawing Sheets

STRUCTURE AND METHOD FOR COUPLING SIGNALS TO AND/OR FROM STACKED SEMICONDUCTOR DIES

TECHNICAL FIELD

This invention relates to semiconductor products, and, more particularly in one or more embodiments, to routing signals to and/or from stacked semiconductor dies in packaged integrated circuit devices.

BACKGROUND OF THE INVENTION

High performance, low cost, increased miniaturization and greater packaging density of integrated circuits have long been goals of the electronics industry. To meet the demand for smaller electronic products, there is a continuing drive to increase the performance of packaged microelectronic devices, while at the same time reducing the height and the surface area or "footprint" of such devices on printed circuit boards. Reducing the size of high performance devices, however, is difficult because the sophisticated integrated circuitry requires more bond-pads, which results in larger packages and more numerous external terminals, such as ball-grid arrays, and thus larger footprints. One technique for increasing the component density of integrated circuit devices within a given footprint is to stack one integrated circuit semiconductor die on top of another.

Although the use of stacked die integrated circuits has greatly increased the circuit density for a given footprint, coupling the dies to each other and to external terminals can be problematic. One approach is to use wire-bonds, in which miniature wires are attached to bonding pads on the die and to externally accessible terminals. However, wire bonding can be difficult, time consuming, and expensive because one die can overlie the bonding pads of another, thus making them inaccessible. It can also be necessary to route wires extending from one die to another around the peripheries of the dies. To alleviate these problems, "flip-chip" techniques have been developed in which the bonding pads of a first die are attached to a device, such as an interposer, through respective conductive elements to the bonding pads of a second die stacked on top of the first die. The conductive elements may comprise minute conductive bumps, balls, columns or pillars of various configurations. The first die is thus electrically and mechanically coupled to the second die. Unfortunately, flip-chip packaging requires that the first die be a mirror image of the second die. As a result, two separate semiconductor die must be laid out and manufactured, albeit the lay out task is relatively straightforward. Also, flip-chip packaging can unduly increase the cost, time, and complexity of packaging the die.

Another approach to interconnecting stacked die is the use of "through-wafer" interconnects. In this approach, conductive paths such as "vias" extend through a die to electrically couple bond-pads of a first die with corresponding bond-pads of a second die that is stacked on top of the first die. One advantage of this approach is that it allows for only a single die to be designed and manufactured. However, disadvantages of this approach include the time, expense and complexity of forming the conductive paths, and the surface area of the die that may be consumed by the conductive paths. Despite these disadvantages, through-wafer packing works very well, particularly for signals coupled to and/or from the same bonding pads on both die, such as, for memory devices, data and address signals. However, where separate signals must be coupled to and/or from corresponding bonding pads on each die, an extra bonding pad normally must be provided for both signals. Also, a routing circuit is fabricated on the die to couple the signals to and/or from the appropriate bonding pads. Furthermore, a second bonding pad and via are provided to couple a signal to control the routing circuit to one of the die. The result can be an undesirable proliferation in the number of external terminals, such as bond pads that are required, which can unduly increase the footprint of the integrated circuit.

It would therefore be desirable to minimize the number of external terminals needed for stacked die, through-wafer packaged integrated circuits.

DETAILED DESCRIPTION

Figure 1:
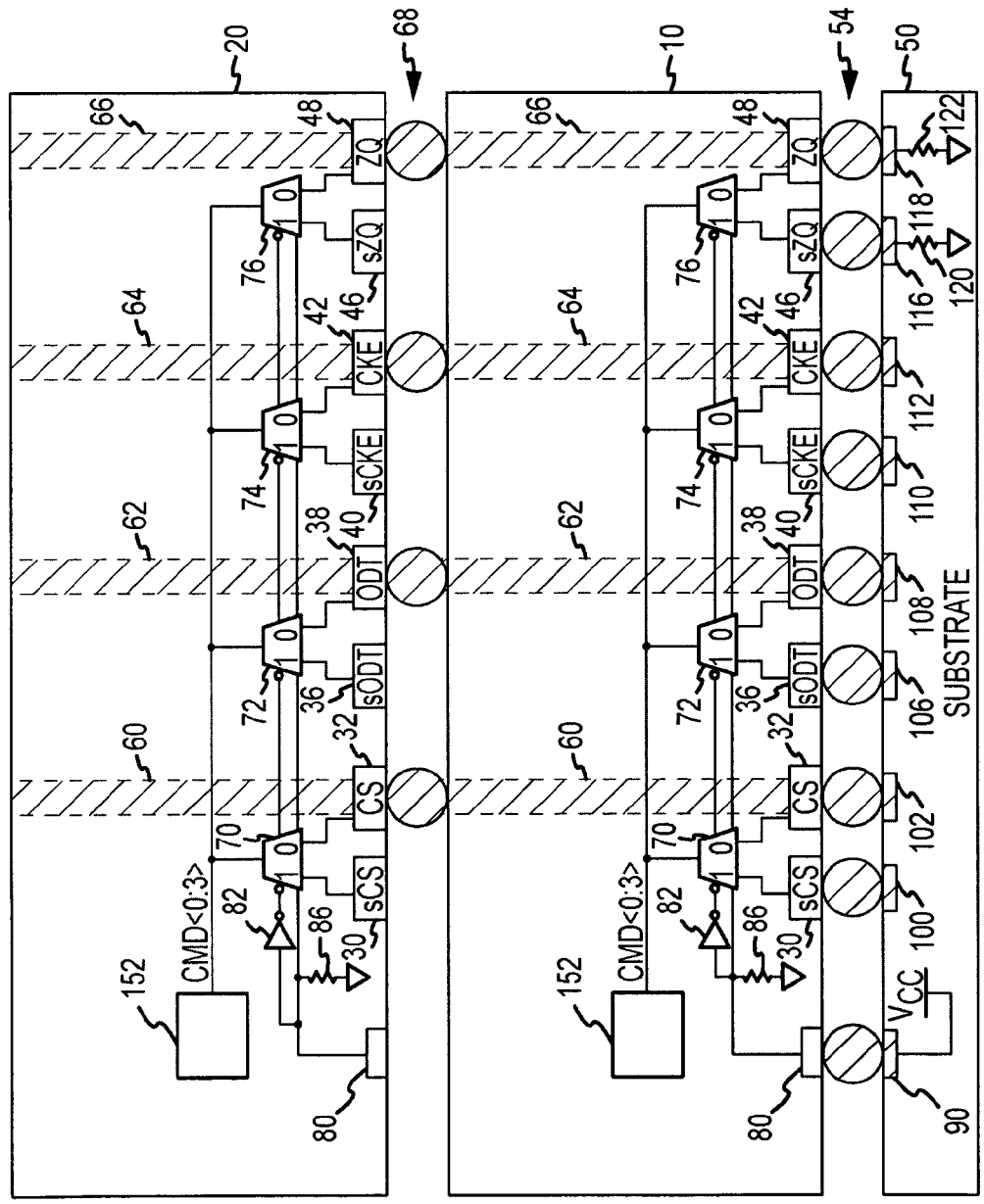
FIG. 1 is a cross-sectional view of a pair of conventionally arranged and configured stacked semiconductor dies.

A cross-section of a pair of stacked dies 10, 20 using a conventional arrangement is shown in FIG. 1. The dies 10, 20 are identical to each other, and they have therefore been provided with the same reference numerals. Each of the dies 10, 20 include a plurality of bonding pads, although only the bonding pads for 4 signals are shown in FIG. 1. Specifically, the dies 10, 20 include a pair of pads 30, 32 for receiving respective chip select (sCS, CS) signals, a pair of pads 36, 38 for receiving respective on-die termination (sODT, ODT) signals, a pair of pads 40, 42 for receiving respective clock enable (sCKE, CKE) signals, and a pair of pads 46, 48 for coupling to respective known impedances (sZQ, ZQ) for use in calibrating the termination impedance of data output buffers (not shown) that output signals to data bus pads (not shown). The pads 30-48 are coupled to respective conductors on a substrate 50 through a grid of conductive balls, generally indicated at 54, which are known as a "ball-grid array." One of the pads 30-48 in each pair is coupled to a respective via 60, 62, 64, 66. A second ball grid array 68 couples the conductive paths 60-66 formed in the lower die 10 to respective ones of the bonding pads 30-48 of the upper die 20. The upper die 20 may also contain these conductive paths 60-66 so that identical dies can be used as either the lower die 10 or the upper die 20. However, the conductive paths 60-66 in the upper die 20 are not used for coupling any signals.

As mentioned above, a die may generally include a large number of bonding pads (not shown) in addition to the bonding pads 30-48 shown in FIG. 1. These bonding pads may couple signals to and/or from the dies 10, 20 in parallel, such as, for example, address and data signals in a memory device. In such case, a single bonding pad can be used for each signal, and each bonding pad of the lower die 10 can be coupled to the corresponding bonding pad of the upper die 20 through a respective via (not shown).

As further shown in FIG. 1, both of the bonding pads 30-48 in each pair are coupled to respective inputs of a multiplexer 70, 72, 74, 76, one of which is provided for each pair of pads 30-48. (Although the multiplexers 70-76 and other components are shown in schematic form in FIG. 1, it will be understood that they are fabricated in each of the semiconductor dies 10, 20). Complementary control terminals of the multiplexers 70-76 are coupled to receive a control signal from a control pad 80 and from an inverter 82. A high-impedance resistor 86 biases the control pad 80 to ground. The resistor 86 may be any type of resistive device, but it will generally be a thin channel transistor biased ON to couple the pad 80 to ground through a high impedance. In the prior art configuration shown in FIG. 1, a total of 9 bonding pads 30-48, 80 are therefore used in addition to the bonding pads used for signals that are common to both dies 10, 20, such as data and address signals as well as clock and control signals.

One of the bonding pads 30-48 in each pair is coupled by the respective multiplexers 70-76 to its output. The particular bonding pad 30-48 in each pair that is "active" depends upon the state of the signals applied to the control terminals of the multiplexers 70-76. The substrate 50 contains a contact pad 90 that is couple to a supply voltage Vcc. The pad 90 is coupled by the ball grid array 54 to the bonding pad 80 of the lower die 10. As a result, the multiplexers 70-76 and inverter 82 in the lower die 10 receive a high signal that causes them to couple the sCS, sODT, sCKE and sZQ pads to circuits fabricated in the die 10. The bonding pad 80 of the upper die 20 remains uncoupled and thus biased low so that the multiplexers 70-76 in the upper die 20 couple the CS, ODT, CKE and ZQ pads to circuits fabricated in the die 20. As a result, CS, ODT and CKE signals may be applied to the lower die 10 through the bonding pads 30, 36, 40 and contact pads 100, 106, and 110, respectively, on the substrate 50 and separate CS, ODT and CKE signals may be applied to the lower die 10 through the bonding pads 32, 38, 42 and the contact pads 102, 108, and 112, respectively. Additionally, two calibration resistors 120, 122 on the substrate 50 are coupled between respective contact pads 116, 118 and ground. These contact pads 116, 118 are coupled by the ball grid array 54 to the sZQ and ZQ pads 46, 48, respectively. As a result, the resistor 120 is coupled to circuits fabricated in the lower die 10, and the resistor 122 is coupled to circuits fabricated in the upper die 20.

Figure 2:
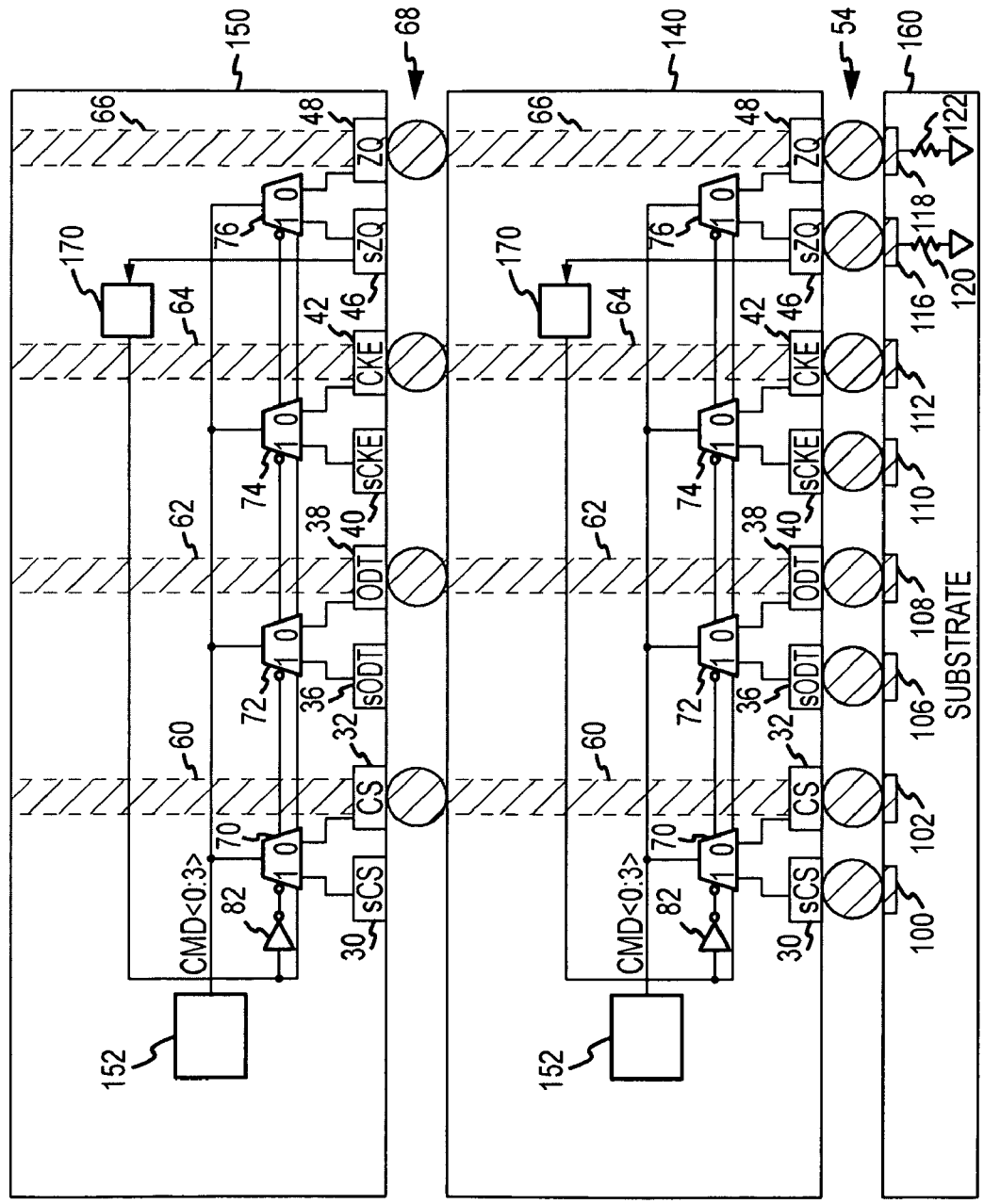
FIG. 2 is a cross-sectional view of a pair of stacked semiconductor dies arranged and configured according to an embodiment of the invention.

Although the prior art technique shown in FIG. 1 is satisfactory for many applications, it would nevertheless be desirable such as for the reasons explained above, to eliminate as many of the bonding pads 30-48, 80 as possible. A technique according to one embodiment of the invention shown in FIG. 2 may be used to eliminate the control bonding pad 80. FIG. 2 shows a pair of dies 140, 150, which are substantially similar to the dies 10, 20 shown in FIG. 1. Further, the dies 140, 150 are mounted on a substrate 160, which is substantially similar to the substrate 50 shown in FIG. 1. In fact, the substrate 160 might differ from the substrate 50 in that it may omit the grounding contact pad 90 (FIG. 1) for supplying a control signal to the multiplexers 70-76.

The dies 140, 150 might differ from the dies 10, 20 shown in FIG. 1 by including a control circuit 170 having an input coupled to the sZQ pad 46 and an output coupled to the multiplexers 70-76 and the inverters 82. The control circuit 170 detects whether the pad 46 is active, e.g., actively being used, for the die 140 or 150. If so, the control circuit 170 causes the multiplexers 70-76 to couple the sCS pad 30, sODT pad 36, sCKE pad 40 and the sZQ pad 46, respectively, to internal circuitry 152. If the control circuit 170 determines that the sZQ pad 46 is not active, it causes the multiplexers 70-76 to couple the CS pad 32, ODT pad 38, CKE pad 42 and the ZQ pad 48, respectively, to the internal circuitry 152.

In the embodiment shown in FIG. 2, the control circuit 170 detects that the sZQ pad 46 is active by detecting the presence of the resistor 120 coupled to the pad 46, i.e., whether the sZQ pad 46 is bonded out. The sZQ pad 46 of the lower die 140 is bonded out so that the resistor 120 is coupled to the sZQ pad 46 of the lower die 140. As a result, the control circuit 170 outputs a high signal to cause the multiplexers 70-76 in the lower die 140 to couple the sCS pad 30, sODT pad 36, sCKE pad 40 and the sZQ pad 46, respectively, of the lower die 140 to the internal circuitry 152. Insofar as the sZQ pad 46 of the upper die 150 is not bonded out, the resistor 120 is not coupled to the sZQ pad 46 of the upper die 150. Therefore, the sZQ pad 46 of the upper die 150 is left floating so that the control circuit 170 in the upper die 150 outputs a low signal to cause the multiplexers 70-76 in the upper die 150 to couple the CS pad 32, ODT pad 38, CKE pad 42 and the ZQ pad 48 of the upper die 150 to the internal circuitry 152.

Although the embodiment shown in FIG. 2 uses the control circuit 170 to determine if the sZQ pad 46 is active, in other embodiments it may determine if another of the pads 30-42 is active. For example, the control circuit 170 may have an input coupled to the sCS pad 30. In response to receipt of an appropriate chip select signal received at the sCS pad 30 (which indicates that the die is the bottom die 140), the control circuit 170 will output a high to cause the multiplexers 70-76 to couple the sCS pad 30, sODT pad 36, sCKE pad 40 and the sZQ pad 46, respectively, to the internal circuitry 152. Other "s" pads may also be used.

Figure 3:
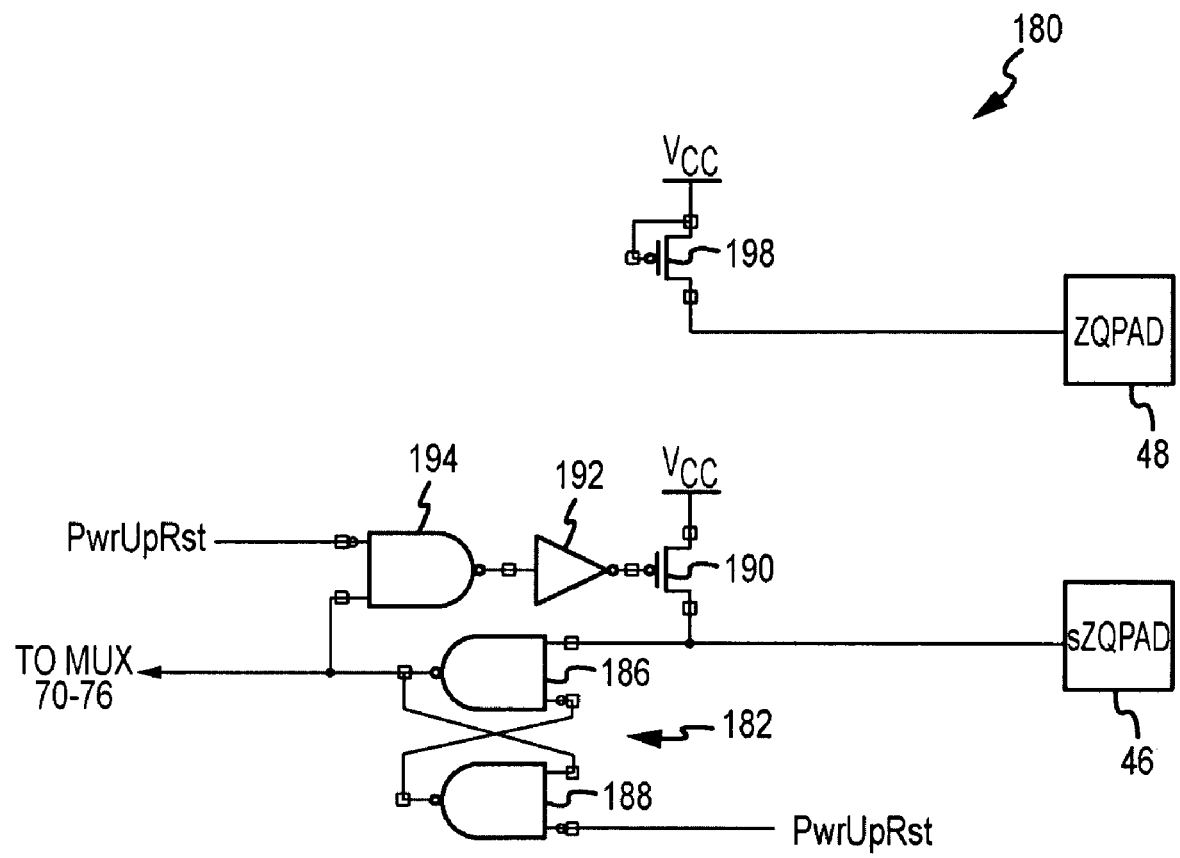
FIG. 3 is a logic and schematic diagram of an embodiment of a control circuit that may be used in the stacked semiconductor dies shown in FIG. 2.

One embodiment of the control circuit 170 is shown in FIG. 3. As shown in FIG. 3, a control circuit 180 might include a flip-flop 182 formed by a pair of NAND gates 186, 188 and having an input coupled to the sZQ pad 46. A second input to the flip-flop 182 receives a PwrUpRst signal, which is low to reset the flip-flop 182 at power up. The sZQ pad 46 is also coupled to a supply voltage Vcc through a PMOS transistor 190 that is controlled by the output of an inverter 192, which is coupled to the output of a NAND gate 194. The NAND gate 194 has one input receiving the PwrUpRst signal and a second input receiving the output of the NAND gate 186. The output of the NAND gate 186 is also applied to the inverter 82 and the multiplexers 70-76, as shown in FIG. 2.

In operation, the low PwrUpRst signal at power up causes the inverter 192 to output a low, which turns ON the transistor 190 to bias the sZQ pad 46 high. At the same time, the low PwrUpRst signal resets the flip-flop 182 thereby causing it to output a low. This low maintains the output of the NAND gate 194 high to render the transistor 190 conductive after the PwrUpRst signal returns to an inactive high state. If the sZQ pad 46 is not bonded out, it remains floating thereby causing the flip-flop 182 to continue outputting a low. As explained above, when the signal applied to the inverter 82 (FIG. 2) and multiplexers 70-76 is low, the multiplexers 70-76 couple the CS pad 32, ODT pad 38, CKE pad 42 and the ZQ pad 48 to the internal circuitry 152. If, on the other hand, the sZQ pad 46 is bonded out, the sZQ pad 46 is coupled to ground through the resistor 120. The resistor 120 has a low enough resistance that it pulls the input to the flip-flop 182 low, thereby causing the flip-flop 182 to output a high. As explained above, when the signal applied to the inverter 82 (FIG. 2) and multiplexers 70-76 is high, the multiplexers 70-76 couple the sCS pad 30, sODT pad 36, sCKE pad 40 and the sZQ pad 46 to the internal circuitry 152. In this way, the control circuit 180 can determine if the sZQ pad 46 is active and couple the correct pads 30-48 to the internal circuitry 152 depending upon whether they are in the lower die 140 or the upper die 150.

As also shown in FIG. 3, the ZQ pad 48 is also coupled to the supply voltage Vcc through a PMOS transistor 198. This transistor 198 is provided so that the capacitive impedance of the ZQ pad 48 matches the capacitive impedance of the sZQ pad 46, but it performs no other function.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor die, comprising:
   an electrical circuit;
   a plurality of conductive paths extending at least partially through the die;
   a first set of external terminals;
   a second set of external terminals, each of the terminals of the second set being paired with a respective one of the terminals of the first set, each of the terminals of the second set being coupled to a respective one of the conductive paths;
   a plurality of multiplexers, wherein each of the multiplexers is coupled to a respective pair of terminals from the first and second sets, each of the multiplexers including a control terminal and respective input terminals coupled to respective ones of the external terminals of the first and second sets, each of the multiplexers being operable to couple either the respective external terminal of the first set or the respective external terminal of the second set to the electrical circuit; and
   a control circuit having an input coupled to one of the external terminals of the first set, the control circuit being operable to determine whether the external terminal to which it is coupled is active, and, at least partially in response thereto, to apply a signal to the control terminals of the multiplexers that cause the multiplexers to couple the external terminals of the first set or the external terminals of the second set to the electrical circuit, the control circuit being operable to determine whether the external terminal of the first set is active based on a voltage level to which the external terminal is biased.

2. The semiconductor die of claim 1 wherein the control circuit is operable to determine whether the external terminal of the first set is active based on the value of a resistance to which the external terminal is coupled.

3. The semiconductor die of claim 1 wherein the control circuit comprises:
   a flip-flop having an input coupled to the external terminal of the first set and an output coupled to the control inputs of the multiplexers, the flip-flop being placed in a first state responsive to the external terminal of the first set being biased to a first voltage, the flip flop being operable in the first state to apply a signal to the control terminals of the multiplexers that cause the multiplexers to couple the external terminals of the first set to the electrical circuit; and
   a bias circuit being operable to bias the external terminal of the first set to a voltage other than the first voltage.

4. The semiconductor die of claim 3 further comprising a reset circuit coupled to an input of the flip-flop and being operable to place the flip-flop in a second state that is different from the first state.

5. A semiconductor device, comprising:
   a first semiconductor die, comprising:
      an electrical circuit;
      a plurality of conductive paths extending at least partially through the die;
      a first set of external terminals;
      a second set of external terminals, each of the terminals of the second set being paired with a respective one of the terminals of the first set, each of the terminals of the second set being coupled to a respective one of the conductive paths;
      a plurality of multiplexers, wherein each of the multiplexers is coupled to a respective pair of terminals from the first and second sets, each of the multiplexers including a control terminal and respective input terminals coupled to respective ones of the external terminals of the first and second sets, each of the multiplexers being operable to couple either the respective external terminal of the first set or the respective external terminal of the second set to the electrical circuit;
      a control circuit having an input coupled to one of the external terminals of the first set, the control circuit being operable to determine whether the external terminal to which it is coupled is active, and, at least partially in response thereto, to apply a signal to the control terminals of the multiplexers that cause the multiplexers to couple the external terminals of the first set or the external terminals of the second set to the electrical circuit; and
   a second semiconductor die stacked on the first semiconductor die, the second semiconductor die comprising:
      an electrical circuit;
      a first set of external terminals;
      a second set of external terminals, each of the terminals of the second set being paired with a respective one of the terminals of the first set, each of the terminals of the second set being coupled to a respective one of the conductive paths in the first die;
      a plurality of multiplexers, wherein each of the multiplexers is coupled to a respective pair of terminals from the first and second sets, each of the multiplexers including a control terminal and respective input terminals coupled to respective ones of the external terminals of the first and second sets, each of the multiplexers being operable to couple either the respective external terminal of the first set or the respective external terminal of the second set to the electrical circuit;
      a control circuit having an input coupled to one of the external terminals of the first set, the control circuit being operable to determine whether the external terminal to which it is coupled is active, and, at least partially in response thereto, to apply a signal to the control terminals of the multiplexers that cause the multiplexers to couple the external terminals of the second set to the electrical circuit; and
      a set of electrical conductors coupling the first and second sets of external terminals of the first semiconductor die to respective externally accessible terminals.

6. The semiconductor device of claim 5 wherein the electrical circuit in each of the dies comprises a memory device.

7. The semiconductor device of claim 5 wherein the second semiconductor die is identical to the first semiconductor die.

8. The semiconductor device of claim 5 wherein the first set of external terminals of the first die are isolated from any of the conductive paths.

9. The semiconductor device of claim 5 wherein the control circuit in each of the dies is operable to determine whether the external terminal of the first set is active based on a voltage level to which the external terminal is biased.

10. The semiconductor die of claim 5 wherein the control circuit is operable to determine whether the external terminal of the first set is active based on the value of a resistance to which the external terminal is coupled.

11. An electronic assembly, comprising:
a substrate having a plurality of pairs of electrical contacts; and
a first semiconductor die mounted on the substrate, the first semiconductor die comprising:
an electrical circuit;
a plurality of conductive paths extending at least partially through the die;
a first set of external terminals, each of the external terminals of the first set being coupled to one of the contacts in a respective pair of the electrical contacts;
a second set of external terminals paired with external terminals of the first set, each of the external terminals of the second set being coupled to respective ones of the conductive paths and to the other contact in a respective pair of the electrical contacts;
a plurality of multiplexers coupled to respective pairs of external terminals of the first and second sets, each of the multiplexers including a control terminal and respective input terminals coupled to external terminals of the first and second sets, each of the multiplexers being operable to couple either the external terminal of the first set or the external terminal of the second set to the electrical circuit;
a control circuit having an input coupled to one of the external terminals of the first set, the control circuit being operable to determine whether the external terminal to which it is coupled is active, and, at least partially in response thereto, to apply a signal to the control terminals of the multiplexers that cause the multiplexers to couple the external terminals of the first set to the electrical circuit; and
a second semiconductor die stacked on the first semiconductor die, the second semiconductor die comprising:
an electrical circuit;
a first set of the external terminals;
a second set of external terminals paired with external terminals of the first set, the external terminals of the second set being coupled to respective ones of the conductive paths of the first die;
a plurality of multiplexers coupled to respective pairs of external terminals of the first and second sets, each of the multiplexers including a control terminal and respective input terminals coupled to external terminals of the first and second sets, each of the multiplexers being operable to couple either the external terminal of the first set or the external terminal of the second set to the electrical circuit; and
a control circuit having an input coupled to one of the external terminals of the first set, the control circuit being operable to determine whether the external terminal to which it is coupled is active, and, at least partially in response thereto, to apply a signal to the control terminals of the multiplexers that cause the multiplexers to couple the external terminals of the second set to the electrical circuit.

12. The electronic assembly of claim 11 wherein the electrical circuit in each of the dies comprises a memory device.

13. The electronic assembly of claim 11 wherein the second semiconductor die is identical to the first semiconductor die.

14. The electronic assembly of claim 11 wherein the first set of external terminals of the first die are isolated from any of the conductive paths.

15. The electronic assembly of claim 11, further comprising a respective resistor coupled to each of the electrical contacts of a first pair of electrical contacts, one of the electrical contacts of the first pair being coupled to the external terminal of the first set to which the control circuit in the first semiconductor die is coupled.

16. The electronic assembly of claim 11 wherein the control circuit is operable to determine whether the external terminal of the first set is active based on the value of a resistance to which the control circuit is coupled.

17. The electronic assembly of claim 11 wherein the control circuit in each of the dies is operable to determine whether the external terminal of the first set is active based on a voltage level to which the external terminal is biased.

18. The electronic assembly of claim 11 wherein the control circuit is operable to determine whether the external terminal of the first set is active based on the value of a resistance to which the external terminal is coupled.

19. A method of coupling signals between a first semiconductor die and a second semiconductor die stacked on the first semiconductor die, the method comprising:
coupling each of the signals directly to and/or from a respective external terminal in one of first and second sets of external terminals on the first die;
coupling at least some of the signals through the first die between a respective external terminal of the second set of external terminals on the first die and a respective external terminal of the second set of external terminals on the second die;
determining in each of the semiconductor dies if a respective one of the external terminals of the first set is active;
if the respective one of the external terminals of the first set is determined to be active, coupling the external terminals in the first set of external terminals of the die to electrical circuits in the respective semiconductor die; and
if the respective one of the external terminals of the first set is determined to not be active, coupling the external terminals in the second set of external terminals of the die to the electrical circuits in the respective semiconductor die.

20. The method of claim 19 wherein the act of determining in each of the semiconductor dies if a respective one of the external terminals of the first set is active comprises determining the value of a resistance coupled to the respective one of the external terminals of the first set.

21. The method of claim 19 wherein the act of determining in each of the semiconductor dies if a respective one of the external terminals of the first set is active comprises determining the magnitude of a voltage of the respective one of the external terminals of the first set.

22. The method of claim 19 wherein the act of determining in each of the semiconductor dies if a respective one of the external terminals of the first set is active comprises determining if a signal is being applied to the respective one of the external terminals of the first set.

23. A method of coupling signals between a first semiconductor die and a second semiconductor die stacked on the first semiconductor die, each of the semiconductor die having first and second sets of external terminals, the method comprising:
coupling each of the external terminals in the second set of the first die through the first die to a respective external terminal in the second set of the second die;
determining in each of the semiconductor dies if a respective one of the external terminals of the first set is active;
if the respective one of the external terminals of the first set is determined to be active, coupling the external terminals in the first set of external terminals of the die to an electrical circuit in the respective semiconductor die; and if the respective one of the external terminals of the first set is determined to not be active, coupling the external terminals in the second set of external terminals of the die to the electrical circuit in the respective semiconductor die.

24. The method of claim 23 wherein the act of determining in each of the semiconductor dies if a respective one of the external terminals of the first set is active comprises determining the value of a resistance coupled to the respective one of the external terminals of the first set.

25. The method of claim 23 wherein the act of determining in each of the semiconductor dies if a respective one of the external terminals of the first set is active comprises determining the magnitude of a voltage of the respective one of the external terminals of the first set.

26. The method of claim 23 wherein the act of determining in each of the semiconductor dies if a respective one of the external terminals of the first set is active comprises determining if a signal is being applied to the respective one of the external terminals of the first set.

* * * * *